United States Patent
Tolonen

(10) Patent No.: US 7,088,998 B2
(45) Date of Patent: Aug. 8, 2006

(54) METHOD AND PRODUCT PALETTE FOR TESTING ELECTRONIC PRODUCTS

(75) Inventor: Jyri Tolonen, Oulu (FI)

(73) Assignee: Elektrobit Testing Oy, Oulunsalo (FI)

( * ) Notice: Subject to any disclaimer, the term of this patent is extended or adjusted under 35 U.S.C. 154(b) by 389 days.

(21) Appl. No.: 10/148,197

(22) PCT Filed: Dec. 7, 2000

(86) PCT No.: PCT/FI00/01076

§ 371 (c)(1),
(2), (4) Date: Oct. 7, 2002

(87) PCT Pub. No.: WO01/42800

PCT Pub. Date: Jun. 14, 2001

(65) Prior Publication Data

US 2003/0109224 A1    Jun. 12, 2003

(30) Foreign Application Priority Data

Dec. 7, 1999   (FI) .................................. 19992622

(51) Int. Cl.
*H04Q 7/20* (2006.01)
(52) U.S. Cl. ................ 455/423; 455/67.11; 455/67.14; 324/765; 324/158.1; 714/718; 714/724; 714/30; 714/38
(58) Field of Classification Search ................ 455/423, 455/67.11, 67.14
See application file for complete search history.

(56) References Cited

U.S. PATENT DOCUMENTS

| | | | | | |
|---|---|---|---|---|---|
| 4,831,540 | A | * | 5/1989 | Hesser | 700/113 |
| 4,922,443 | A | * | 5/1990 | Coetsier et al. | 702/188 |
| 5,872,458 | A | * | 2/1999 | Boardman et al. | 324/758 |
| 5,935,264 | A | * | 8/1999 | Nevill et al. | 714/724 |
| 6,090,632 | A | * | 7/2000 | Jeon et al. | 438/14 |
| 6,115,835 | A | * | 9/2000 | Nevill et al. | 714/724 |
| 6,121,787 | A | * | 9/2000 | Jacobson et al. | 324/765 |
| 6,154,712 | A | * | 11/2000 | Breu et al. | 702/82 |
| 6,927,596 | B1 | * | 8/2005 | Bjork | 324/765 |

FOREIGN PATENT DOCUMENTS

EP           0848260           6/1998

* cited by examiner

*Primary Examiner*—Marceau Milord
(74) *Attorney, Agent, or Firm*—Oblon, Spivak, McClelland, Maier & Neustadt, P.C.

(57) ABSTRACT

A product palette for carrying an electronics product on a production line for electronics products. The product palette includes a signal interface for establishing a signal connection between the product palette and the product, and a test arrangement connected to the signal interface. The test arrangement is used for subjecting the product to one or more test operations on the product palette by the signal interface.

10 Claims, 7 Drawing Sheets

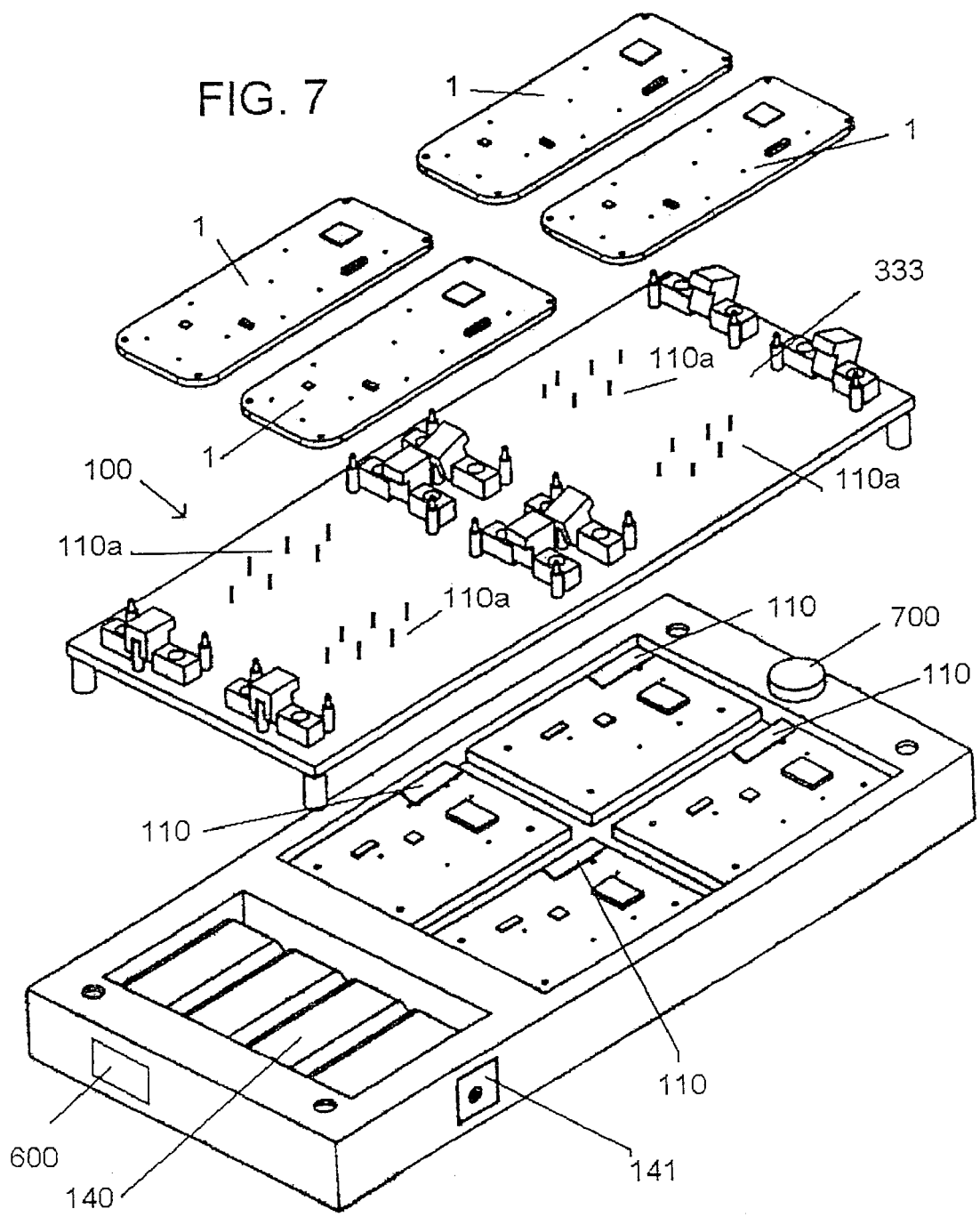

METHOD AND PRODUCT PALETTE FOR TESTING ELECTRONIC PRODUCTS

BACKGROUND OF THE INVENTION

The invention relates to a method of testing an electronics product, the method comprising placing the product on a product palette, moving the product palette and the product on it along a production line to a work-station on the production line for performing operations on the product.

The invention also relates to a product palette for carrying an electronics product on a production line for electronics products.

The second embodiment of the invention relates to a method of subjecting an electronics product to operations.

The product can be e.g. a finished device, a semi-finished product or a circuit board provided with components and wirings. The product may be e.g. a mobile phone to be tested with or without the battery or a circuit board of a mobile phone with components and wirings. It is clear that the product to be tested can also be some other product.

Prior art methods and solutions for testing electronics products, such as mobile phones, comprise moving of the product to be tested on a product base, i.e. a palette, along a testing line via one or more test stations. Testing is performed at the test stations and the palette functions as a base along which the product is moved to the test station and away from the test station. The prior art solutions often employ an arrangement in which a rack provided with several expensive measuring devices is placed in the test station or attached to it. The rack also comprises test devices which perform some relatively simple test operations.

The prior art solutions have several disadvantages, which are particularly related to the fact that the actual testing period of the product is short compared to the time the product spends on the testing line. The testing period of the product can be only 20% of the total period the product spends on the testing line because most of the time the product only lies on the palette as the palette moves towards a test station or away from the test station. The palette may also be stationary on the testing line. Another problem is that testing is not very efficient because both complex and simple test devices perform their test operations one at a time, i.e. one after the other. Since several aspects of the product cannot be tested at the same time, the other test devices are inutile as one test device included in the same entity performs testing. To keep the capacity of the production line high, it has been necessary to increase the number of test stations. Naturally each test station must have been provided with a separate rack of testing devices. The price of test devices provided in a test rack serving one test station may amount to USD 200,000. Increase of the number of test stations and test devices also requires more floor area, which adds the costs and makes it more difficult to change the layout of the apparatuses at a production facility.

In prior art solutions related to the second embodiment of the invention, transmission of data on operating settings to the product, e.g. transmission of software to a mobile phone, has been implemented by connecting the phone directly to a PC, for example, from which the software of the phone has been transmitted to the phone. This step requires unnecessary moving of the product and connection of the phone to a separate device, e.g. to a PC. Furthermore, the above-mentioned underutilization of time also constitutes a problem.

BRIEF DESCRIPTION OF THE INVENTION

The object of the invention is to provide a test method, a method of directing operations and a product palette which sufficiently meet the requirements of modern electronics production.

For achieving the above-mentioned object, the test method of the invention is characterized in that the method comprises performing one or more test operations on a product in the product palette before and/or after a work-station by feeding one or more test impulses from the product palette into the product on the palette, the method comprising detecting in the product palette the influence of one or more test impulses on the product to be tested on the palette.

The product palette of the invention is characterized in that the product palette comprises a signal interface for establishing a signal connection between the product palette and the product, and a test arrangement connected to the signal interface, the test arrangement being used for performing one or more test operations on the product in the product palette via the signal interface.

According to the second embodiment of the invention, the method of subjecting an electronics product to operations in characterized in that the method comprises feeding, information once or several times from the product palette to the product before and/or after the workstation by feeding one or more data on operating settings from the product palette to the product on the palette.

The product palette according to the second embodiment of the invention is characterized in that the product palette comprises a signal interface for establishing a signal connection from the product palette to the product, and the product palette comprises a memory which is connected to the signal interface and from which the product palette feeds to the product data on operating settings the product needs for its operation.

The invention is based on the fact that the product palette is provided with intelligence sufficient for feeding information to the product. The embodiment related to testing is based on connecting the devices needed for testing to the palette at least in respect of some test operations, and thus testing can also be carried out somewhere else than at the test stations. Regardless of whether the product and the palette move or whether they are stationary somewhere on the testing line, testing can be carried out at any time, provided that the product is on the palette. The second embodiment of the invention, i.e. the embodiment of subjecting the product to data transmission operations, is based on the fact that the palette is provided with intelligence and memory for transmitting data on operating settings from the palette to the product on the palette. The common features of the embodiments of the invention include a signal connection from the palette to the product and transmission of information from the palette via this signal connection to the product. In the first embodiment the information to be transmitted consists of test impulses. Furthermore, in the first embodiment a response to the impulse is also transferred from the product to the palette. In the second embodiment the information transferred from the palette to the product consists of data on operating settings.

An advantage of the method and product palette according to the embodiment of the invention related to testing is that they provide more testing alternatives and testing can be performed in phases. Furthermore, it is unnecessary to increase the size and number of test stations because part of testing, or in some cases whole testing, can be carried out on the product base, i.e. the palette, when the palette and the product move or when they are stationary. The solution according to the invention thus utilizes the large amount of time that was wasted in the previous solutions, i.e. the time the product was on the palette when the palette was moving outside the test station or was stationary. The solution according to the invention allows to shorten the duration of production phases. The solution of the invention also brings considerable savings in the costs,because the number of expensive test devices decreases and testing becomes faster. The advantages of the embodiment related to subjecting the product to operations, i.e. the embodiment related to data transmission, are related to the above-mentioned aspect, i.e. to the fact that time is used more efficiently and thus production is also more efficient.

The test operations performed on the palette and/or transmission of data on operational settings from the palette to the product can take place at any time and anywhere before and/or after the workstation. This means that they do not need to be carried out right before the workstation or right after it, but clearly at a distance from the workstation both temporally and physically.

BRIEF DESCRIPTION OF THE DRAWINGS

The invention will be described in greater detail by means of preferred embodiments with reference to the accompanying drawings, in which FIG. 7 is an exploded view of FIG. 6.

DETAILED DESCRIPTION OF THE INVENTION

Figure 1:
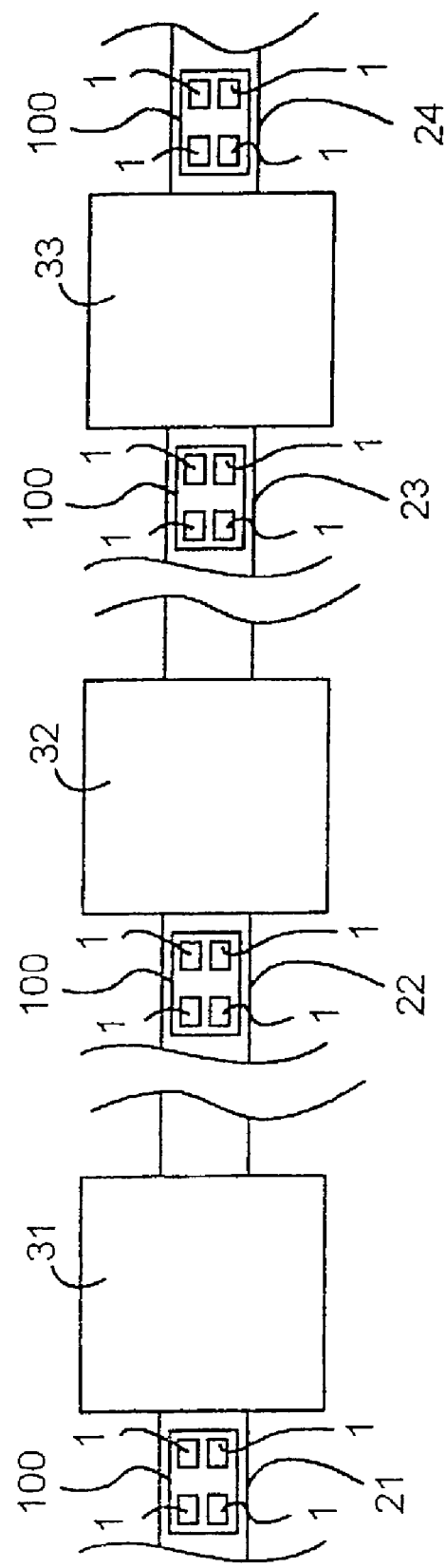
FIG. 1 is a schematic top view of a production line for an electronics product.

In the figures the invention is applied on a production line 2 for electronics products 1. It should be noted that testing is one of the operations performed on the production line. The figure illustrates a production line 2, which comprises one or more conveyers 21 to 24 and one or more workstations 31 to 33. The workstations 31 and 33 shown in the figure are e.g. test stations and the workstation 32 is a station which manufactures the product further, e.g. loads components, carries out soldering or the like. The figures show product palettes 100, which carry one or more products 1. In the example illustrated in the figures the product palette 100 carries four products 1. The conveyers 21 to 24 are e.g. conveyor belts or chain conveyors which move the product palettes 100 and the products 1 on them.

Figure 2:
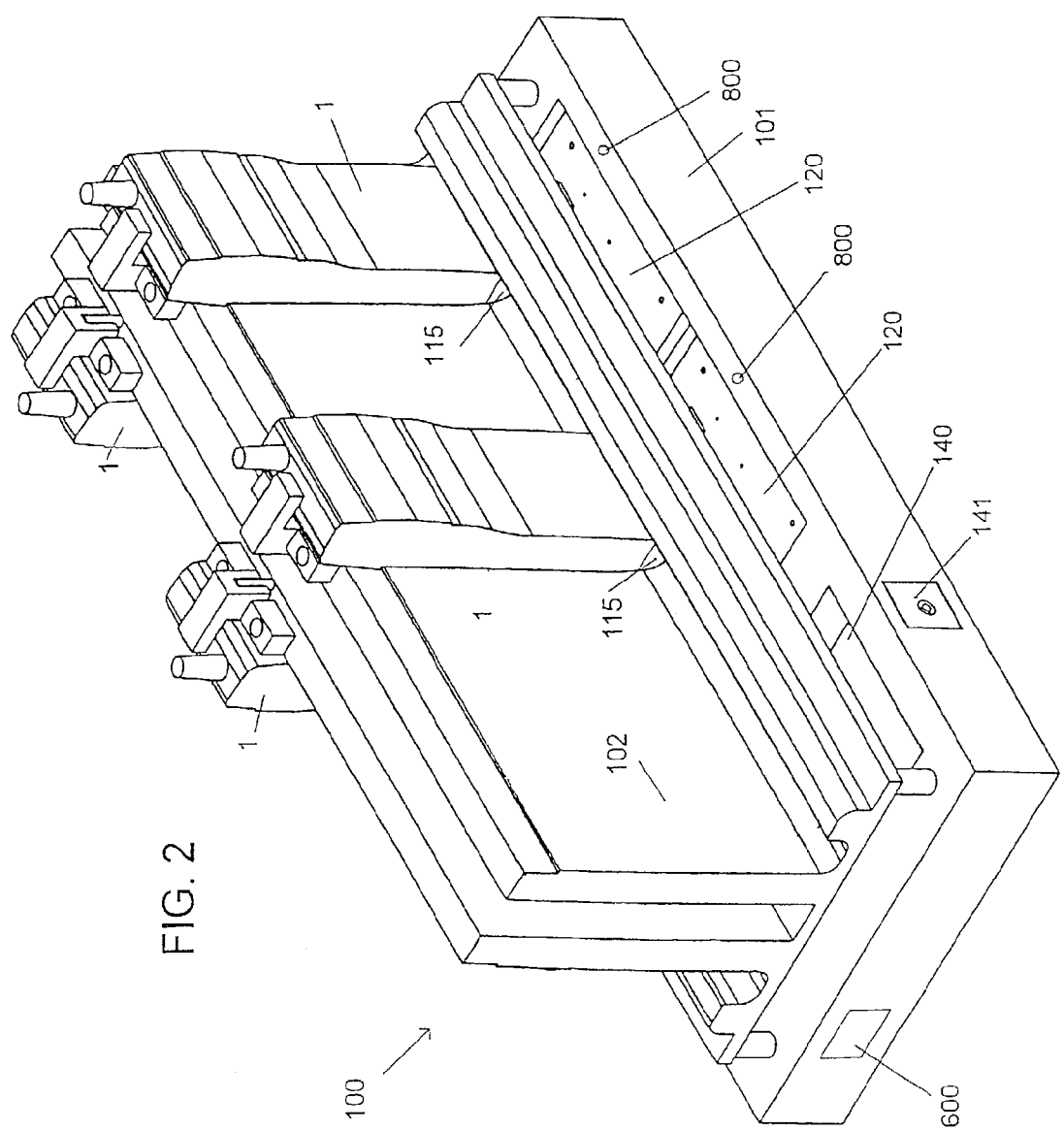
FIG. 2 illustrates a product palette with four products.
Figure 3:
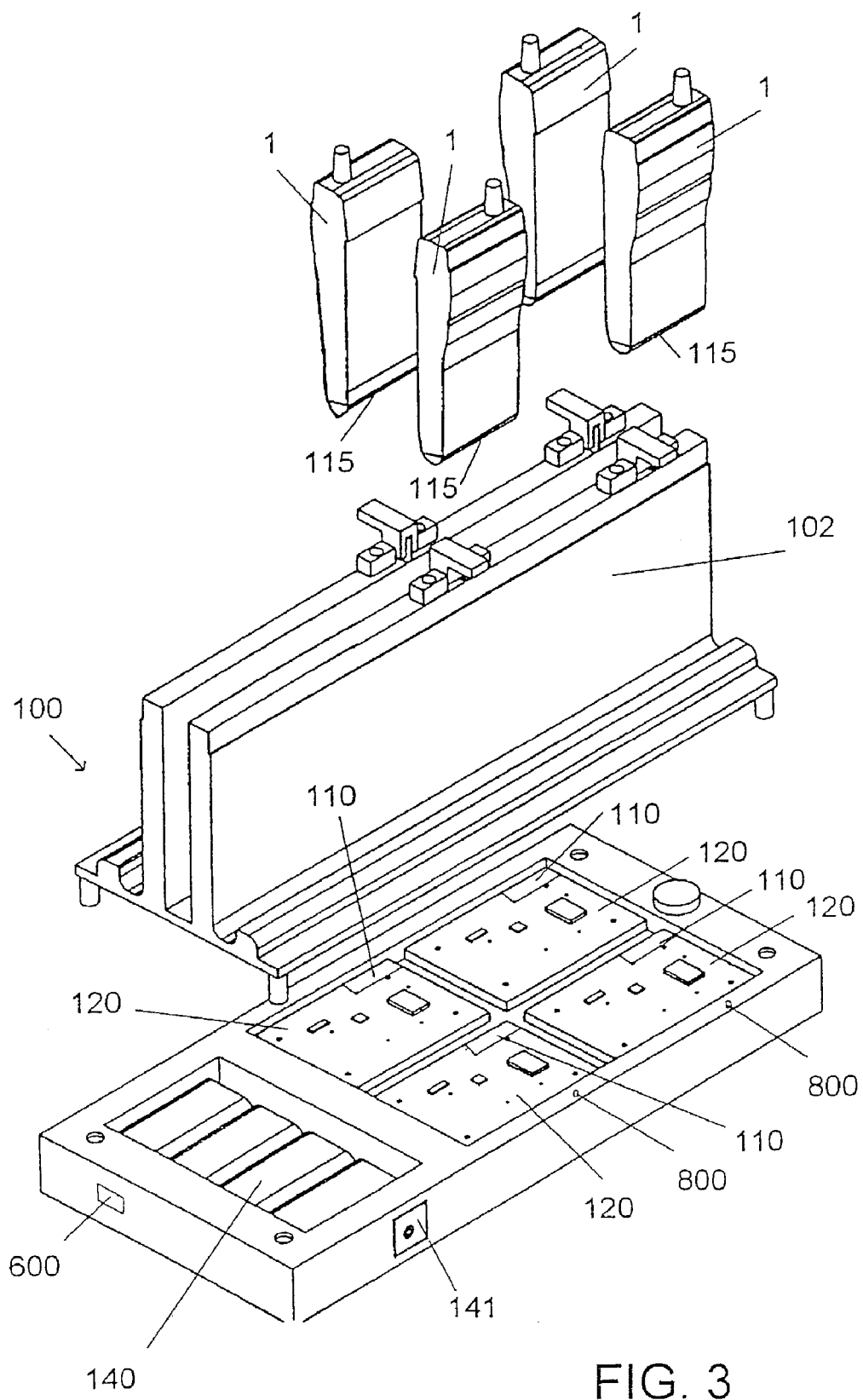
FIG. 3 is an exploded view of FIG. 2.
Figure 6:
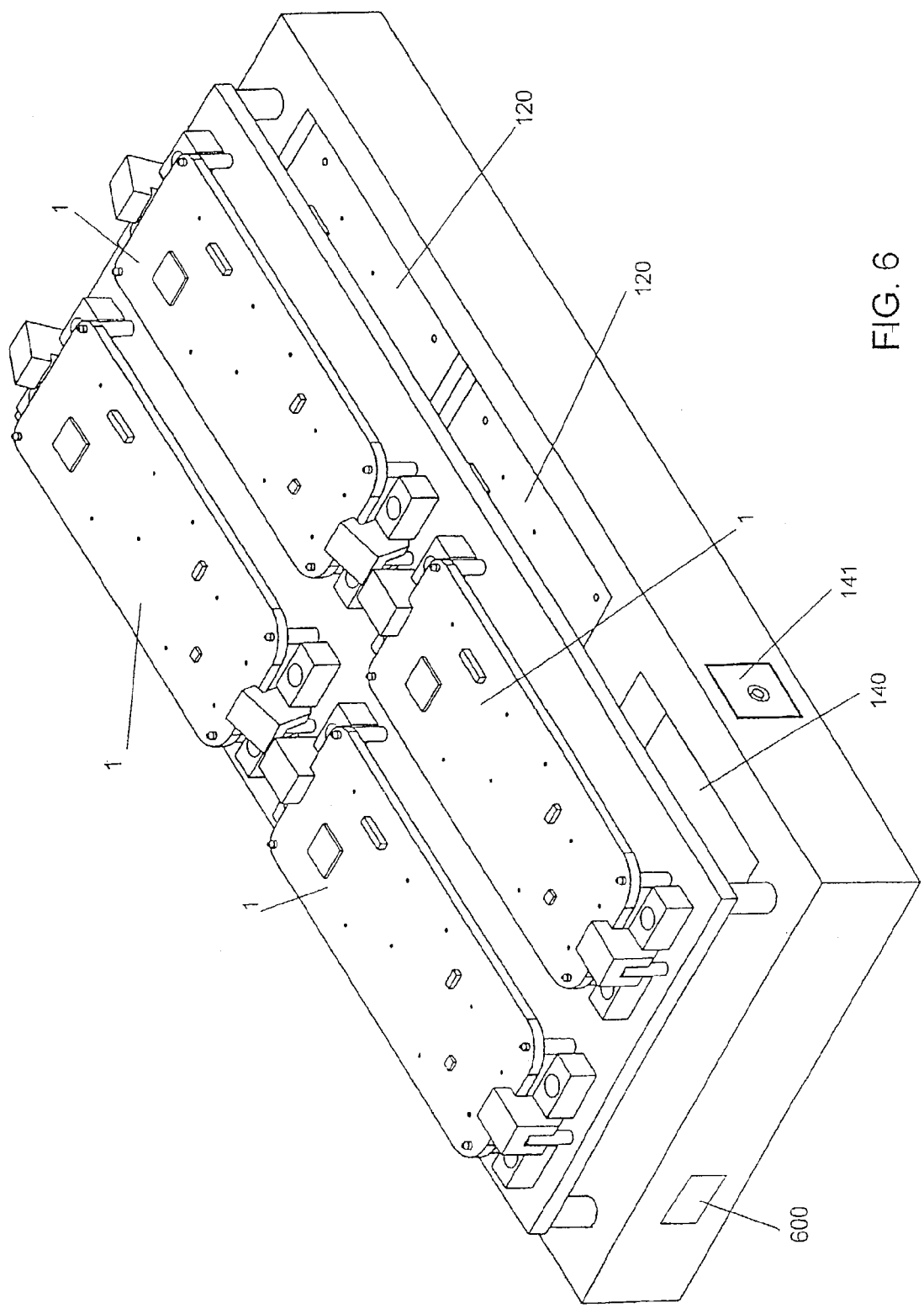
FIG. 6 illustrates a product palette with four semi-finished products.

According to FIGS. 2 and 3, the product to be tested or treated otherwise may be a complete product or a nearly complete product 1 which lacks a power source, such as a battery or the like. The product 1 can also be a semi-finished product as shown in FIGS. 6 and 7 or another unfinished product, such as a circuit board with components and wirings. In a preferred embodiment the product 1 to be tested is an electronics product 1 provided with a user interface and/or a display, e.g. a mobile phone or another wireless radio transceiver terminal 1, such as a paging device. Testing can be performed with or without the power source of the product. In most mobile phone models there is a SIM card is under the battery, and thus testing is performed without the battery so that a connection can be established from the test support in the test unit to connectors provided for the SIM card in the product. Another reason for testing without the battery is that the operation of the product needs to be tested at deviating voltage values.

The product palette comprises a body 101, whose lower surface, for example, is placed against the conveyer on the production line. The body comprises a support 102 which supports the products 1, or the support rests on the body.

In respect of the embodiment related to testing, it is essential that the product palette comprises a signal interface 110 for establishing a signal connection between the product palette 100 and the product 1, and a test arrangement 120 connected to the signal interface, which is used for performing one or more test operations on the product 1 via the signal interface 110. The signal interface 110 may also be included in the test arrangement. The signal interface 110 can establish a connection to a connector 115 provided in the product, a contact area or to a similar point, for instance. In FIGS. 6 and 7 the signal connection also comprises components 110a, which in FIGS. 6 and 7 are probes which are provided in a probe piece 333 and whose lower surface is connected to component 110.

To make the product palette more independent, the test arrangement in the product palette comprises a test impulse generator 122, 123 for generating one or more test impulses in the product palette and a test impulse feeder for feeding one or more test impulses to the product on the product palette, the feeder being connected to the test impulse generator. In the test arrangement of the product palette the test impulse generator 122, 123 comprises a generator 122 of analogue impulses and/or a generator 123 of digital impulses. The test arrangement in the product palette further comprises a detector 124, 125 for detecting the influence of the one or more test impulses on the product to be tested on the product palette 100. In the test arrangement of the product palette the detector of the impulse influence comprises a detector 124 of analogue responses and a detector 125 of digital impulses.

In the product palette the test arrangement and/or the product palette comprises an energy source 140 which provides energy for generating one or more test impulses, and thus an external energy source is unnecessary. The energy source 140 also supplies the energy needed to detect the responses to the impulses. The energy source can also supply the energy needed to drive the products, especially if no battery is attached to the product 1. The product palette also comprises a charging connection 141 for charging the energy source 140 of the product palette. Charging can be carried out in one or more workstations 131 to 133, for example.

The first embodiment of the invention relates to a method of testing an electronics product. The method comprises placing the product 1 on a product palette 100 and moving the product palette 100 with the product 1 on it along a production line to a workstation on the production line to subject the product to operations. The idea of the invention is that before and/or after the operations to be performed at the workstation, i.e. before the product on the product palette arrives at the workstation, one or more test operations are performed on the product on the product palette by feeding one or more test impulse from the product palette to the product on the palette. The method also comprises detecting the influence of one or more test impulses on the product to be tested on the product palette.

The impulse to be fed from the product palette 100 to the product 1 is an analogue signal and/or a digital signal. The analogue impulse generated by the analogue impulse generator 122 is e.g. a signal of 500 mA, which is fed as a calibration signal into the charger interface of the product, such as a phone, which is in the area of the connector 115, for example. An example of a digital impulse signal is a signal which is generated by the digital impulse generator 123 and renders a pin of the phone connector to the ground potential to simulate a situation where e.g. handsfree equipment, i.e. the ear-piece and microphone (headset), is connected to the phone connector.

In addition to the responses to the above-mentioned impulses, the responses to be detected may include an analogue response used as control voltage or as another control signal for an external device to be connected to the phone wirelessly or with a cable. The digital response can be e.g. a digital control related to the function of the phone's data link or digital data transmission related to handshaking for activating the data link. In hand-shaking the phone notifies the other party, e.g. a notebook computer, with a bit that the phone will reserve the transmission connection for itself, although in testing the situation is only simulated, i.e. the object is to make the phone or the like to produce the desired response by means of the impulse.

Figure 4:
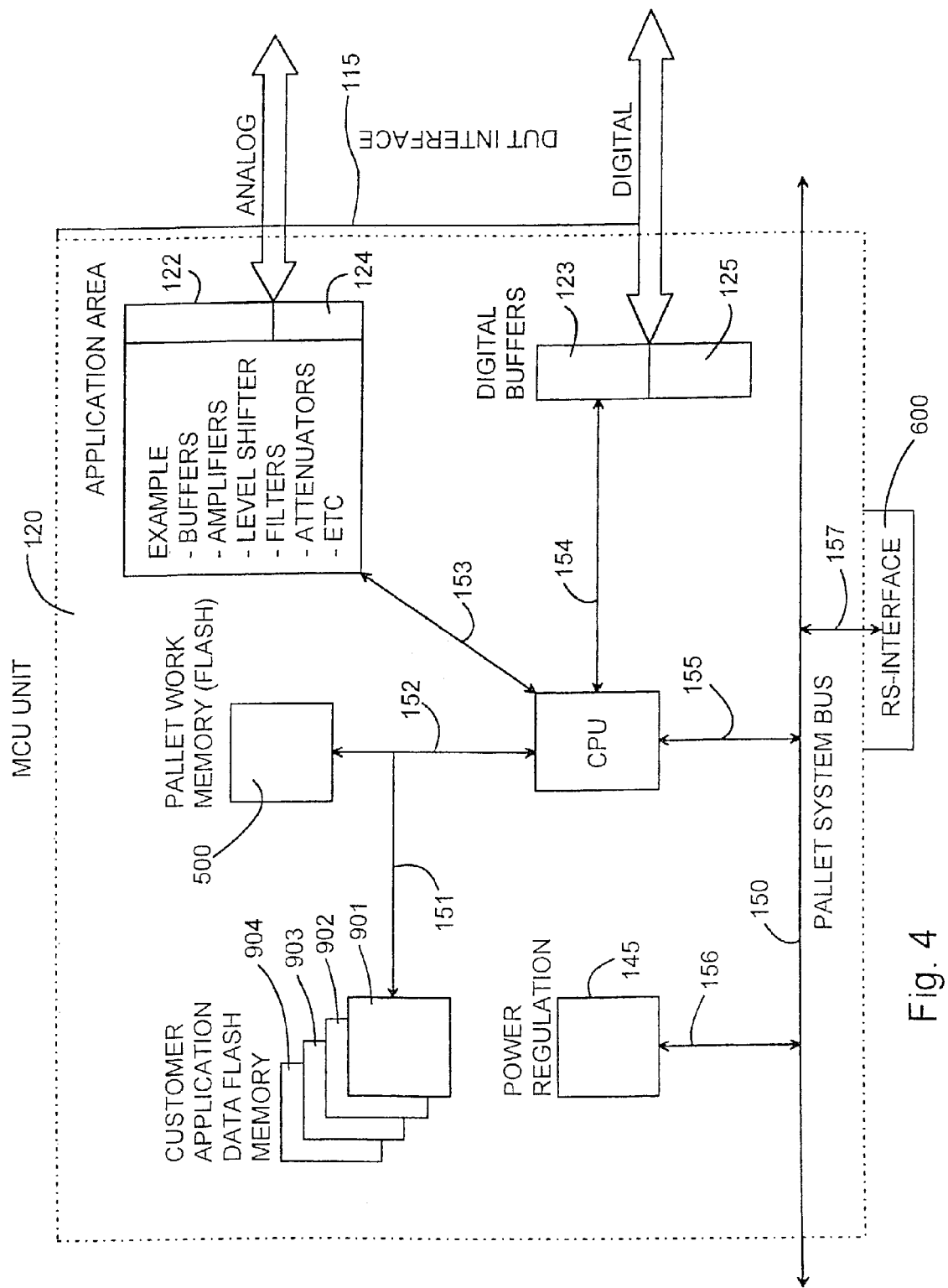
FIG. 4 is a block diagram illustrating a test arrangement.
Figure 5:
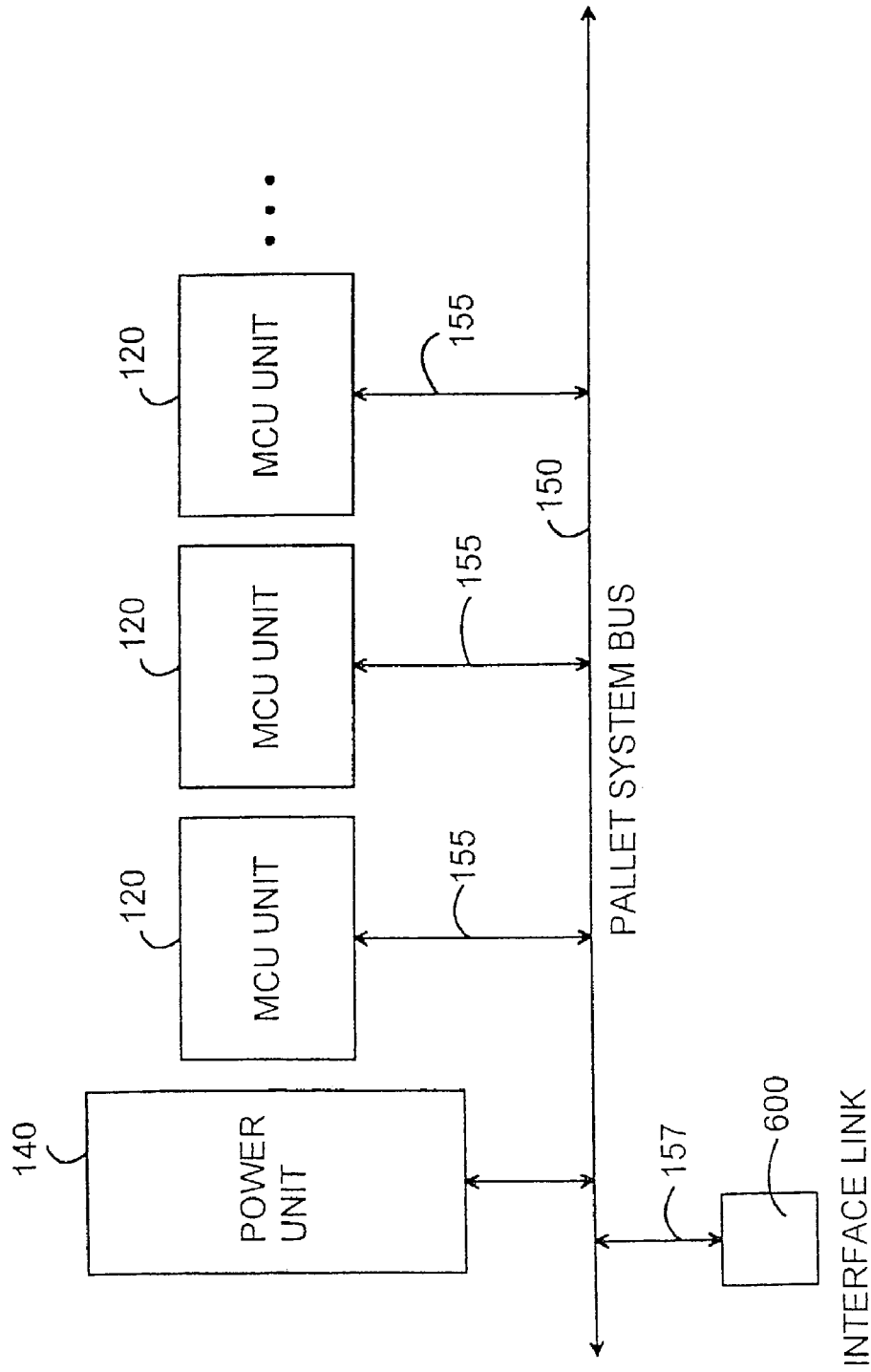
FIG. 5 is a block diagram illustrating several test arrangements provided in the same product palette.

In FIGS. 4 and 5 the test arrangement is implemented by means of a controller unit MCU (MicroControllerUnit), for example. The MCU comprises a processor, i.e. a CPU, an analogue I/O (Input/Output) 122, 124 and a digital I/O 123, 125. Reference number 110 denotes the signal connection for the traffic between the product palette and the product. In FIG. 4 the abbreviation DUT means 'Device under test', i.e. the product to be tested. The controller unit also comprises a power control block 145, which adjusts the energy obtained from the battery 140 of the product palette to render it suitable. FIGS. 4 and 5 also show a transmission route 150 via which the test arrangement can be connected to other test arrangements on the same product palette, mainly because they have a common energy source 140. The arrangement further comprises connections 151 to 155 via which the CPU controls the other components of the test arrangement. In addition, the arrangement comprises a connection 156 via which the power controller 145 communicates with the transmission route 150. The arrangement also comprises a connection 157 on which the arrangement can communicate with a transmission connection 600, via which e.g. response information can be transmitted to an external system, e.g. to an information system which controls the production.

The first embodiment of the invention functions as follows: the impulse blocks 122 and/or 124 controlled by the CPU generate one or more test impulses of the desired type, and one or more responses induced by the impulse are measured with one or more detectors 123, 125 controlled by the CPU. There are several uses for the measured, i.e. detected, responses to the test impulses. One way is to store them in a memory 500 for later retrieval and/or transmit the responses to an external system via the transmission connection 600, for example. The transmission connection 600 is e.g. an RS232 connection. A third way is to generate an indication of the response content with LED indicator lights or with some other indicator 800. The indication shows e.g. that a detected response deviates from the expected response to such an extent that the product needs to be repaired. The palette 100 is preferably also provided e.g. with an IR connection, i.e. an infrared connection, with a connection of the Bluetooth type or with another transmission connection 700 via which the palette 100 communicates with the information system of production control (e.g. Line Management System). Instead of the optical IR connection, another kind of optical connection, i.e. a laser connection, can be used. Instead of the optical connection, a radio frequency connection can be used, e.g. the above-mentioned Bluetooth connection or a WLAN connection. A suitable data transmission rate for the transmission connection 700 is 9800 Bit/s to 2 Mbit/s. On the palette side the wireless transmission connection 700 is implemented as one or more independent devices, i.e. as communication module(s) connected to the palette's system bus. One palette may comprise several communication modules, i.e. the connection may be an optical transmission connection covering the neighbouring area or a connection covering the whole route of the palette, such as a WLAN connection. Communication can be used for loading variation of data on operating settings, i.e. new data, into the memory of the palette when the production lot changes, in other words, when products with different software are to be manufactured. Communication via the connection 700 can also be used for routing the palette during production. The communication can connect the palette to a line management system, which can manage statistical information e.g. on the number of products flashed on the palette, i.e. to how many products data on operating settings, such as operating software, have been transmitted from the flash memory of the palette. The battery status can also be monitored. The transmission connection 700 can be used for the same purpose as the transmission connection 600.

Progress of the palette on the production line is controlled by the line management system. For this purpose the test designer can configure different routes for progress, which are in practice implemented by communication between the palette and the line management system by means of the wireless connection 700, e.g. the IR connection 700. The commands related to the line management should also be defined so that they correspond to the SCPI standard as much as possible. One of the most important instances of communication between the palette and the line management system is the transfer of test results on the product tested via the line management system to the statistics data of the production line. The transmission connection 700 is implemented with a transmitter and a receiver.

FIG. 4 also shows a memory 901 to 904 consisting of one or more parts or a memory entity consisting of several memories 901 to 904, but the memory 901 to 904 is more relevant to the second embodiment, which will be described later in this application. It should be noted, however, that the features of the second embodiment may be additional features of the first embodiment and vice versa.

The moment at which testing is performed on the product palette 100 may be one or more of the following: when the product palette 100 moves on the production line, when the product palette 100 is stationary on the production line, after the product palette 100 has been removed from the production line.

Viewed as a whole, testing preferably consists of phases, i.e. in the method preferably at least one workstation is a test station, and thus in the method part of testing is performed in the product palette 100, which is characteristic of the first embodiment, and part of testing is performed in the test station 131, 133 according to the prior art.

The second embodiment of the invention relates to transmission of data on operating settings to the product. Reference is made particularly to FIG. 4 and the memory 901 to 904 shown in it, which is preferably a Flash memory. The second embodiment is characterized in that data on operating settings are transferred from the memory 901 to 904 provided in the palette to the product on the palette. The data on operating settings in the memory, which the product palette 100 feeds to the product 1, consist of one or more sets of software and/or one or more sets of programs the product 1 needs for its operation. For example, in the memory 901 to 904 each memory section 901 to 904 comprises operating software for a different product model, and thus e.g. software related to product model ABCD of a phone manufacturer is fed to the product 1 from the product palette 100. The data on operating settings can also be a language packet, i.e. software or part of it in a certain language. In that case the memories 901 to 904 could include the menu program in four languages, of which one is transferred from the memory of the product palette 100 to the telephone, e.g. from memory 901. The third data on operating settings could include software related to the operators graphic operator logo or part of it. If the manufacturer produces phones for networks of four operators, for example, on the same production line in the same lot, each memory 901 to 904 includes the software related to the logo of a different operator. All the above-mentioned data on operating settings as well as other data can also be included in the same product palette 100. For example, the sub-parts of memory 901 could include the operating software of several phones, the sub-parts of memory 902 could comprise language packet programs for several languages, and the sub-parts of memory 903 could comprise software related to several operator logos. The size of the flash memory is e.g. about 20 to 40 MB, but it should be noted that as memory circuits and technology develop, the size of the palette's flash memory may also increase considerably in the future, mainly because the products (e.g. a mobile phone) into which the operating software is fed from the palette's flash memory become more complex and will be provided with new features. Consequently, the operating software will also require more memory capacity in the future. The software of the palette's main processor (CPU) is performed from the palette's flash memory, and thus in the preferred embodiment the software controlling the palette's operation is included in the above-mentioned flash memory together with the operating software or other data on settings to be fed from the palette into the product. The above-mentioned way, i.e. the use of a common flash memory, simplifies the implementation and makes it faster. The software controlling the operation of the palette requires less capacity than 5 MB. In the preferred embodiment the size of the memory area to be reserved for the product's settings data in the panel's flash memory must be larger and approximately correspond to program versions of two target devices, i.e. products to be tested, i.e. a capacity of e.g. 20 to 40 MB is sufficient.

It is not necessary to feed the data on operating settings before testing of the circuit board (rough version of the product) after SMD stacking. A program is usually fed for operational testing. The data on operating settings can be fed before or after the test impulse and testing of the first phase. The data on operating settings are often fed before because the process has more capacity for a time-consuming operation. After operational testing the data needed to customize the product are fed (language, operator, etc.). Data on operating settings can also be loaded into the products after production at service.

The second embodiment of the invention functions as follows: data on operating settings are transferred from one or more memories 901 to 904 controlled by the CPU via the signal connection 110 to the memory of the product 1, such as a phone 1.

The palette preferably comprises several products, and thus there are e.g. several test arrangements, as appears from FIG. 5. The energy source 140 can be common.

The moment at which data are transmitted from the product palette 100 to the product 1 can be one or more of the following: when the product palette 100 moves on the production line, when the product palette 100 is stationary on the production line, after the product palette 100 has been removed from the production line.

Finally we will describe activation of the product 1, i.e. switching-on of operating energy, which is carried out using an activation signal. If the product does not include a source of operating voltage for the product 1, a power source or another source for operating signal, the above-mentioned activation signal is a signal which includes the operating signal. If the product is not activated by feeding the operating signal to the product, the activation of the above-mentioned operating signal can be provided in the same or in a different activation signal. This switches the product on and thus corresponds to the POWER ON command of the main switch. If the product tested comprises a source for operating voltage, a power source or another source for operating signal, such as the battery of the phone, the above-mentioned activation signal refers to control from the product palette, which switches on the operating signal of the source of operating signal included in the product. In other words, this command switches the product on and corresponds to the POWER ON command of the product's main switch or the like, but it is performed via an interface in the product, such as a bottom connector. The term activation should thus be interpreted broadly, i.e. it does not only comprise switching-on of an existing or a fed operating signal, but also feeding of an operating signal. The activation signal enables activation or directly activates the product. Alternatively, there are at least two activation signals: the first activation signal feeds the operating signal to the product 2 (enables activation), and the second activation signal functions as a command to switch the operating signal on, i.e. as a command to switch the product 1 on (activates).

It is obvious to a person skilled in the art that as the technology advances, the inventive concept can be implemented in various ways. The invention and its embodiments are not limited to the examples described above, but may vary within the scope of the claims.

The invention claimed is:

1. A product palette for carrying an electronics product on a production line, comprising:
   a signal interface configured to establish a signal connection between the product palette and the product; and
   a test arrangement connected with the signal interface, the test arrangement being used for subjecting the product to one or more test operations in the product palette by the signal interface;
   wherein the product palette is configured to be moved on the production line, the test arrangement of the product palette comprises at least one generator of test impulses for generating at least one test impulse in the product palette, and the generator of test impulses is connected to the signal connection that connects the product palette and the product for feeding at least one test impulse from the product palette to the product on the product palette.

2. The product palette of claim 1, wherein the test arrangement of the product palette comprises a detector for detecting influence of at least one test impulse on the product to be tested on the product palette.

3. The product palette of claim 1, wherein the test arrangement of the product palette and/or the product palette comprises an energy source configured to provide energy for generating one or more test impulses.

4. The product palette of claim 1, wherein in the test arrangement of the product palette, the test impulse generator comprises a generator of analog impulses.

5. The product palette of claim 1, wherein in the test arrangement of the product palette, the test impulse generator comprises a generator of digital test impulses.

6. The product palette of claim 2, wherein in the test arrangement of the product palette, the detector of the impulse influence comprises a detector of analog responses.

7. The product palette of claim 2, wherein in the test arrangement of the product palette, the detector of the impulse influence comprises a detector of digital responses.

8. The product palette of claim 2, wherein the product palette comprises means for transferring data on operating settings the product needs for its operation from the product palette to the product.

9. The product palette of claim 8, wherein the product palette comprises a memory configured for data on operating settings and the memory is connected to the means for transferring data on operating settings.

10. The product palette of claim 8, wherein the data on operating settings the product palette feeds to the product include at least one set of software and/or at least one set of programs the product needs for its operation.

* * * * *